United States Patent [19]

Tachimori et al.

[11] Patent Number: 5,534,446
[45] Date of Patent: Jul. 9, 1996

[54] PROCESS FOR PRODUCING BURIED INSULATOR LAYER IN SEMICONDUCTOR SUBSTRATE

[75] Inventors: Masaharu Tachimori; Takayuki Yano; Yasuo Tsumori; Tatsuo Nakajima; Isao Hamaguchi, all of Kawasaki, Japan

[73] Assignee: Nippon Steel Corporation, Japan

[21] Appl. No.: 534,169

[22] Filed: Sep. 26, 1995

[30] Foreign Application Priority Data

Sep. 30, 1994 [JP] Japan ............... 6-237896

[51] Int. Cl.$^6$ .................................. H01L 21/265
[52] U.S. Cl. .................. 437/26; 437/24; 437/247
[58] Field of Search ............... 437/24, 26, 247, 437/62

[56] References Cited

U.S. PATENT DOCUMENTS

| | | | |
|---|---|---|---|
| 4,749,660 | 6/1988 | Short et al. | 437/24 |
| 4,810,664 | 3/1989 | Kamins et al. | 437/26 |
| 4,837,172 | 6/1989 | Mizuno et al. | 437/24 |
| 4,975,126 | 12/1990 | Margail et al. | 437/24 |
| 5,080,730 | 1/1992 | Wittkower | 437/24 |
| 5,143,858 | 9/1992 | Tomozane et al. | 437/24 |
| 5,196,355 | 3/1993 | Wittkower | 437/24 |
| 5,310,689 | 5/1994 | Tomozane et al. | 437/24 |
| 5,436,175 | 7/1995 | Nakato et al. | 437/24 |
| 5,441,899 | 8/1995 | Nakai et al. | 437/24 |
| 5,468,657 | 11/1995 | Hsu | 437/24 |

FOREIGN PATENT DOCUMENTS 1-99456  8/1989  Japan ............... 437/24

Primary Examiner—George Fourson
Assistant Examiner—S. Mulpuri
Attorney, Agent, or Firm—Pollock, Vande Sande & Priddy

[57] ABSTRACT

A process for producing a semiconductor substrate, including the phases of implanting oxygen ions into a semiconductor silicon substrate through one surface thereof to form a high oxygen concentration layer in the semiconductor silicon substrate, and then heat-treating the semiconductor substrate to cause a chemical reaction to occur between the implanted oxygen ions and the silicon, thereby forming an insulating silicon oxide film in the semiconductor silicon substrate, wherein the heat treatment phase includes at least a heat treatment step using an atmosphere having an oxygen partial pressure of $5\times10^3$ Pa or more.

The process is advantageously used to produce a high quality SOI semiconductor substrate in which the number of the defects providing a path for current leakage is reduced, the buried oxide layer has an improved dielectric breakdown strength, the interface between the buried oxide film and the adjoining silicon layers has a small roughness, and the buried oxide film can be produced with a wider range of thickness.

20 Claims, 7 Drawing Sheets

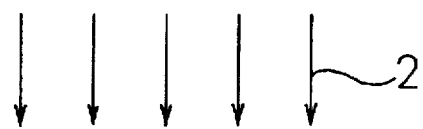
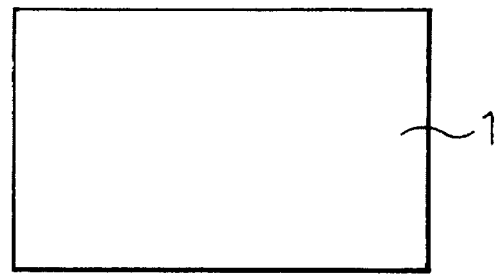
Fig.1(a) PRIOR ART
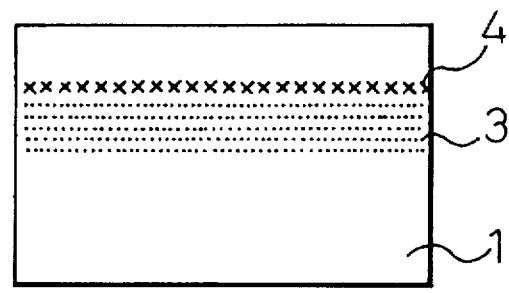
Fig.1(b) PRIOR ART
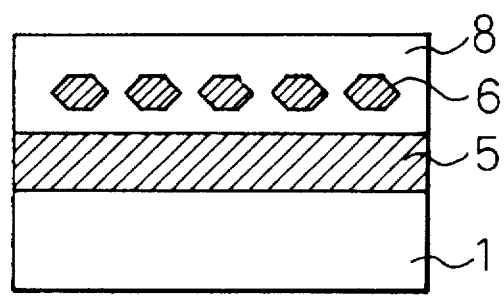
Fig.1(c) PRIOR ART
Fig.1(d) PRIOR ART

PROCESS FOR PRODUCING BURIED INSULATOR LAYER IN SEMICONDUCTOR SUBSTRATE

BACKGROUND OF THE INVENTION

1. Field of the Invention

The present invention relates to a process for producing a semiconductor substrate, particularly a silicon-on-insulator (hereinafter referred to as SOI) substrate having a silicon dioxide film (hereinafter referred to as a buried oxide film) located inside a semiconductor silicon substrate, formed by implanting oxygen ions into the semiconductor silicon substrate and then heat-treating the substrate.

2. Description of the Related Art

Processes of forming a buried oxide film in a semiconductor silicon substrate by implanting oxygen ions into the semiconductor silicon substrate and then heating the substrate, are disclosed in Japanese Unexamined Patent Publication (Kokai) Nos. 62-188,239, 3-240, 230, and 4-264,724, U.S. Pat. No. 4,676,841, and J. Mater. Res., vol. 8 (1993), pp. 523–534. The heat treatment temperature, time, and atmosphere are disclosed in 1990 IEEE SOS/SOI TECHNOLOGY CONFERENCE PROCEEDINGS, pages 45, 47, and 48 and also in Materials Science and Engineering, B12(1992), pp. 27–36 and pp. 41–45. The disclosed heat treatment atmospheres are nitrogen gas alone at normal pressure, argon gas alone, a mixture of nitrogen gas and 0.5% to 1% oxygen gas, and a mixture of argon gas and 0.5% to 1% oxygen gas.

FIGS. 1(a) to 1(d) and 2(a) to 2(c) show a conventional process of forming a buried oxide film in a semiconductor silicon substrate.

FIGS. 1(a) to 1(d) represent semiconductor silicon substrate having an oxygen atom density of less than $4.0 \times 10^{22}$ atoms/cm$^3$ established by oxygen ion implantation.

Referring to FIG. 1(a), oxygen ions 2 are implanted into a semiconductor silicon substrate 1 through one surface thereof, for example, at a dose of from $0.3 \times 10^{18}$ ions/cm$^2$ to $0.4 \times 10^{18}$ ions/cm$^2$ and an ion implantation energy of from 150 keV to 220 keV.

Referring to FIG. 1(b), the semiconductor silicon substrate 1 with implanted oxygen ions has, in the inside thereof, a high oxygen concentration layer 3 and a high defect density layer 4 containing atomic vacancies or other crystal defects generated by the ion implantation.

Referring to FIG. 1(c), the semiconductor silicon substrate 1 is then heat-treated, for example, at a temperature of 1300° C. or higher in an atmosphere of argon gas mixed with 0.5% oxygen gas for a time of about from 15 minutes to 1 hour, with the result that the implanted oxygen precipitates to form a silicon oxide layer 5 in the region of the high oxygen concentration layer 3 and also forms silicon oxide islands 6 in the region of the high defect density layer 4.

Referring to FIG. 1(d), the heat treatment is continued for further 2 hours to 6 hours with the result that the silicon oxide islands 6 disappear by being incorporated in the silicon oxide layer 5, as the former are disadvantageous in free energy, while the silicon oxide layer 5 grows to form a buried oxide film 7 with a semiconductor silicon film 8 formed thereon.

FIGS. 2(a) to 2(c) represent semiconductor silicon substrates having an oxygen atom density of $4.0 \times 10^{22}$ atoms/cm$^3$ or more established by oxygen ion implantation.

Referring to FIG. 2(a), oxygen ions 2 are implanted into a semiconductor silicon substrate 1 through one surface thereof, for example, at a dose of from $1.25 \times 10^{18}$ ions/cm$^2$ to $2.2 \times 10^{18}$ ions/cm$^2$ and an ion implantation energy of from 150 keV to 220 keV.

Referring to FIG. 2(b), the semiconductor silicon substrate 1 implanted with the oxygen ions has, in the inside thereof, a silicon oxide layer 5. A high defect density layer containing crystal defects is generated during the ion implantation, but disappears by being overlapped with the silicon oxide layer 5 upon completion of the ion implantation.

Referring to FIG. 2(c), the semiconductor silicon substrate 1 is then heat-treated, for example, at a temperature of 1300° C. or higher in an atmosphere of argon gas mixed with 0.5% oxygen gas for a time of about from 2 hours to 1 hour, with the result that the silicon oxide layer 5 grows to form a buried oxide film 7 with a semiconductor silicon film 8 formed thereon.

The SOI substrate produced by the above-mentioned conventional process has the following problems. One problem is that the buried oxide film contains microdefects lacking in oxygen atoms due to spatial fluctuation of the precipitation, because the buried oxide layer is formed by the precipitation of the ion-implanted oxygen atoms and grows by Ostwald ripening of the precipitate. Nucl. Inste. Meth. B84 (1994), page 270 describes that the microdefects lacking in oxygen atoms may provide a path for current leakage or may substantially reduce the dielectric breakdown strength of the buried oxide film in comparison with a thermal silicon oxide film. Moreover, the interface between the buried oxide film and the adjoining silicon layers has a roughness ten times or more than the roughness of the interface between a thermal oxide film and the adjoining silicon layers obtained by thermally oxidizing a mirror-finished silicon substrate as used in the usual semiconductor production process.

Another problem of the conventional processes is that the oxygen ion dose, i.e., the amount of implanting oxygen ions per unit area is limited to an extremely small range in order to provide an SOI substrate having a buried oxide film and surface silicon layer of good quality, as can be seen from J. Mater, Res. vol. 8 (1993), pp. 523–534 or Mater. Sci. Eng. B12 (1992), pp. 41–45. Therefore, in the above literature, the obtained buried oxide film has an extremely limited thickness range of about from 80 to 90 nm.

Thus, the buried oxide film 7 obtained by the conventional process contains a substantial amount of the microdefects lacking in oxygen atoms and providing a path for electric current leakage and also has a large roughness of the interface between the buried oxide layer and the adjoining semiconductor silicon film 8. Moreover, the buried oxide film obtained by the conventional process has a substantially fixed thickness (in cm) determined by dividing the amount of implanting oxygen ions (in ions/cm$^2$) by $4.48 \times 10^{22}$.

Therefore, when the SOI substrate produced by the conventional process is used to fabricate an integrated circuit, the current leakage and fluctuation in threshold values of the transistors leads to the problems that the product yield of the IC chips is reduced and that the IC design is materially limited by the thickness of the buried oxide film.

SUMMARY OF THE INVENTION

The object of the present invention is to provide a process for producing a high quality SOI semiconductor substrate in which the number of the defects providing a path for current leakage is reduced, the buried oxide layer has an improved dielectric breakdown strength, the interface between the buried oxide film and the adjoining silicon layers has a small roughness, and the buried oxide films can be produced with a wider range of thickness.

To achieve the object according to the present invention, there is provided a process for producing a semiconductor substrate, including the phases of implanting oxygen ions into a semiconductor silicon substrate through one surface thereof to form a high oxygen concentration layer in the semiconductor silicon substrate, and then heat-treating the semiconductor substrate to cause a chemical reaction to occur between the implanted oxygen ions and the silicon, thereby forming an insulating silicon oxide film in the semiconductor silicon substrate, wherein the heat treatment phase includes at least a heat treatment step using an atmosphere having an oxygen partial pressure of $5 \times 10^3$ Pa or more.

The heat treatment step using an atmosphere having an oxygen partial pressure of $5 \times 10^3$ Pa or more is preferably performed at a temperature of from 1100° C. to 1410° C., more preferably from 1330° C. to 1410° C.

The heat treatment step using an atmosphere having an oxygen partial pressure of $5 \times 10^3$ Pa or more is preferably performed for a time of from 5 minutes to 8 hours.

The process according to the present invention preferably further includes, prior to the heat treatment step using an atmosphere having an oxygen partial pressure of $5 \times 10^3$ Pa or more, another heat treatment step using an oxygen partial pressure of $0.1 \times 10^3$ Pa or more and less than $5 \times 10^3$ Pa, a heat treatment temperature of from 1300° C. to 1410° C., and a heat treatment time of from 5 minutes to 6 hours.

The process preferably further includes, after the heat treatment step using an atmosphere having an oxygen partial pressure of $5 \times 10^3$ Pa or more, another heat treatment step using an oxygen partial pressure of less than $5 \times 10^3$ Pa, a heat treatment temperature of from 1300° C. to 1410° C., and a heat treatment time of from 5 minutes to 6 hours.

Preferably, the heat treatment phase is completed by a final heat treatment step using an oxygen partial pressure of $5 \times 10^3$ Pa or less and a reduction of heat treatment temperature to 1300° C. or less.

Preferably, the heat treatment phase is completed by a final heat treatment step using an oxygen partial pressure of less than $5 \times 10^3$ Pa and a reduction of heat treatment temperature to 1050° C. or less.

Preferably, in the final heat treatment step, the oxygen partial pressure is less than $5 \times 10^3$ Pa and the speed of the reduction of heat treatment temperature is 2.5° C./minute or less.

Preferably, the atmosphere of the heat treatment step using an atmosphere having an oxygen partial pressure of $5 \times 10^3$ Pa or more is composed of 100% oxygen or a mixture of oxygen and at least one selected from the group of argon, helium, and nitrogen.

Preferably, the atmosphere of the heat treatment step using an atmosphere having an oxygen partial pressure of less than $5 \times 10^3$ Pa is composed of one selected from the group of: a mixture of oxygen and at least one selected from the group of argon, helium, and nitrogen; 100% nitrogen; and 100% argon.

Preferably, the oxygen ions are implanted at a dose of from $0.3 \times 10^{18}$ ions/cm$^2$ to $0.4 \times 10^{18}$ ions/cm$^2$ and an implantation energy of from 150 keV to 220 keV.

Preferably, the oxygen ions are implanted at a dose of from $1.25 \times 10^{18}$ ions/cm$^2$ to $2.2 \times 10^{18}$ ions/cm$^2$ and an implantation energy of from 150 keV to 220 keV.

BRIEF DESCRIPTION OF THE DRAWINGS

FIGS. 1(a) to 1(d) are cross-sectional views showing the steps of the conventional process of forming a buried oxide film in a semiconductor silicon substrate having an ion-implanted oxygen atom density of less than $4.0 \times 10^{22}$ atoms/cm$^3$.

DESCRIPTION OF THE PREFERRED EMBODIMENTS

Figure 3A:
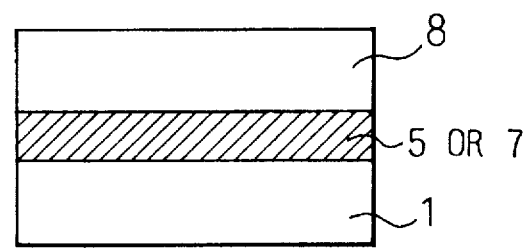
FIGS. 3(a) and 3(b) are cross-sectional views showing the first effect of the oxygen partial pressure of the heat treatment atmosphere on the formation of a buried oxide film, according to the present invention.
Figure 3B:
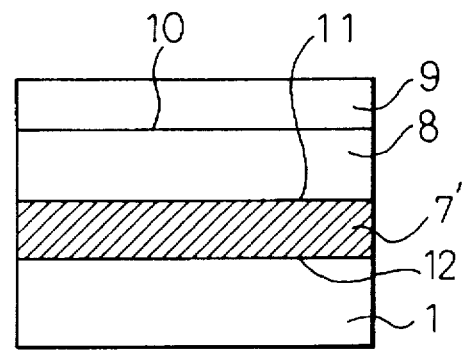

Referring to FIGS. 3(a) and 3(b), the first effect of the oxygen partial pressure of the heat treatment atmosphere will be described.

Figure 2A:
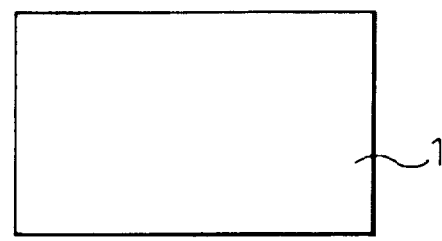
FIGS. 2(a) to 2(c) are cross-sectional views showing the steps of the conventional process of forming a buried oxide film in a semiconductor silicon substrate having an ion-implanted oxygen atom density of $4.0 \times 10^{22}$ atoms/cm$^3$ or more.
Figure 2B:
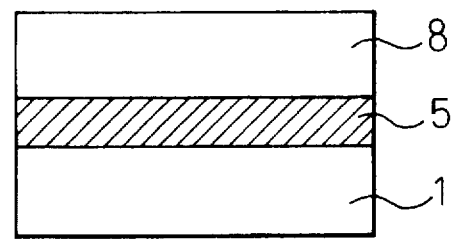
Figure 2C:
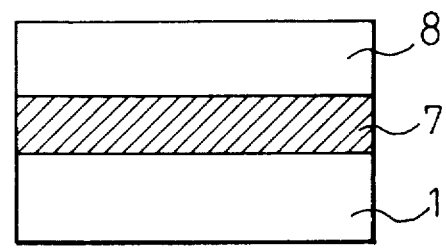

FIG. 3(a) shows a semiconductor silicon substrate 1 having a buried oxide film 7, or a silicon oxide layer 5, formed inside the substrate 1 and a semiconductor silicon film 8 formed in the surface of the substrate 1, as shown above in FIGS. 1(d), 2(b), or 2(c).

Referring to FIG. 3(b), the semiconductor silicon substrate 1 is then heat-treated at an elevated temperature in an atmosphere having an oxygen partial pressure of $5 \times 10^3$ Pa or more, with the result that the surface of the semiconductor silicon film 8 is oxidized by the oxygen in the heat treatment atmosphere to form a silicon dioxide film 9. The oxygen of the atmosphere is further dissolved in the silicon dioxide film 9 and diffuses through the silicon dioxide film 9 to an interface 10 between the silicon dioxide film 9 and the semiconductor silicon film 8. The oxygen then reacts with silicon atoms at the interface 10 to form silicon dioxide. This reaction increases the thickness of the silicon dioxide film 9 and decreases the thickness of the single crystalline silicon film 8.

When the speed of the oxygen supply to the interface 10 is greater than the speed of the oxygen consumption at the interface 10, unreacted excessive oxygen is dissolved in the semiconductor silicon film 8 and diffuses through the semiconductor silicon film 8 to an interface 11 between the semiconductor silicon film 8 and the buried oxide film 7'. The oxygen then reacts with silicon atoms at the interface 11 to form silicon dioxide. This reaction decreases the thickness of the semiconductor silicon film 8 and increases the thickness of the buried oxide film 7'.

Excessive oxygen from the reaction at the interface 11 is dissolved in the buried oxide film 7', diffuses through the buried oxide film 7', extinguishing the defects lacking in oxygen atoms, and reaches an interface 12 between the buried oxide film 7' and the semiconductor silicon substrate 1. The oxygen then reacts with silicon atoms at the interface 12 to form silicon dioxide. The reaction at the interface 12 also increases the thickness of the buried oxide film 7'.

To increases the thickness of the buried oxide film 7', the speed of the oxygen supply by the diffusion through the silicon dioxide film 9 to the interface between the silicon dioxide film 9 and the semiconductor silicon film 8 must be greater than the speed of the oxygen consumption at the interface so as to provide excessive oxygen to be dissolved in the semiconductor silicon film 8.

The oxygen flow by the diffusion through the silicon dioxide film 9 to the interface is increased by the increase of the amount of oxygen dissolved in the silicon dioxide film 9. The amount of oxygen dissolved in the silicon dioxide film 9 is proportional to the oxygen partial pressure of the atmosphere under the Henry's law. Therefore, by using an oxygen partial pressure of the atmosphere of a certain value or more, the thickness of the buried oxide film 7' can be increased while extinguishing the defects lacking in oxygen atoms in the buried oxide film 7'. The experiment conducted by the present inventors showed that the thickness of the buried oxide film 7' is increased when the oxygen partial pressure is $5 \times 10^3$ Pa or more.

Figure 4A:
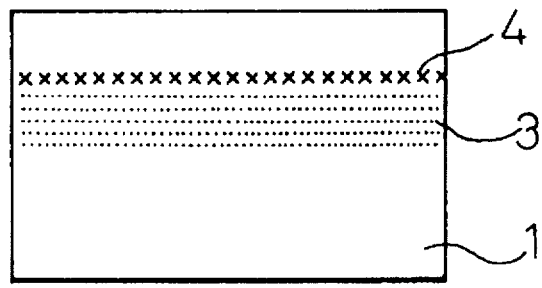
FIGS. 4(a) to 4(c) are cross-sectional views showing the second effect of the oxygen partial pressure of the heat treatment atmosphere on the formation of a buried oxide film, according to the present invention.
Figure 4B:
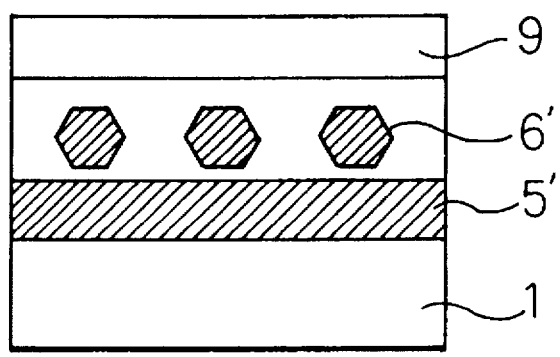
Figure 4C:
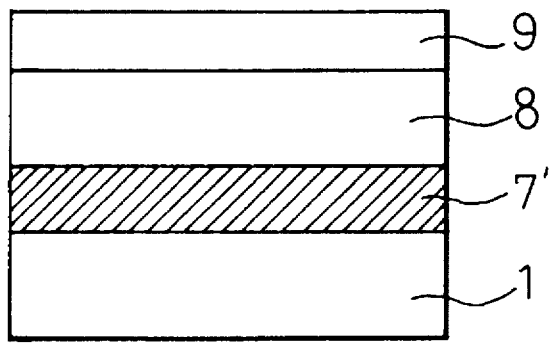

Referring to FIGS. 4(a) to 4(c), the second effect of the oxygen partial pressure of the heat treatment atmosphere will be described.

FIG. 4(a) shows a semiconductor silicon substrate 1 having a high oxygen concentration layer 3 and the high defect density layer 4, formed inside the substrate 1, as shown above in FIG. 1(b).

Referring to FIG. 4(b), the semiconductor silicon substrate 1 is then heat-treated at an elevated temperature in an atmosphere having an oxygen partial pressure of $5 \times 10^3$ or more, with the result that the surface of the semiconductor silicon film 8 is oxidized by the oxygen in the heat treatment atmosphere to form a silicon dioxide film 9 and the ion-implanted oxygen precipitates to form a silicon oxide layer 5' and silicon oxide islands 6' as described above referring to FIG. 1(c).

The silicon oxide layer 5' and the silicon oxide islands 6' are grown both by the precipitation of the oxygen dissolved from the atmosphere and by the oxidation growth at the interface between the semiconductor silicon layer and the silicon oxide layer due to the oxygen dissolved from the atmosphere under the effect described referring to FIG. 3(b), so that the thickness of the silicon oxide layer 5' and the size of the silicon oxide islands 6' are increased.

Referring to FIG. 4(c), a heat treatment using an oxygen partial pressure of the atmosphere of less than $5 \times 10^3$ Pa is then carried out to extinguish the silicon oxide islands 6' by incorporating the islands in the silicon oxide layer 5', with the result that the buried oxide film 7' having an increased thickness can be obtained. In the thus-obtained buried oxide film 7', the defects lacking in oxygen atoms have also disappeared, as in the case shown in FIGS. 3(a) and 3(b).

According to the above-described process of the present invention shown FIGS. 3(a) and 3(b) and 4(a) to 4(c), the interface between the buried oxide film 7' and the semiconductor silicon film 8 is oxidized in the same manner as in the usual thermal oxidation, so that the interface has a roughness as small as that of the interface between the usual thermal oxide film and a semiconductor silicon substrate.

Figure 5:
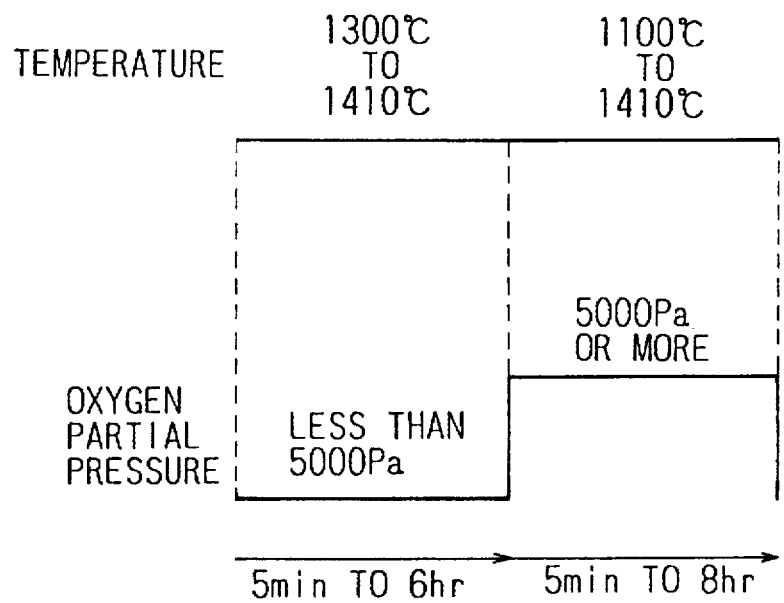
FIG. 5 is a diagram showing the temperature-oxygen partial pressure combination as a function of time according to a preferred embodiment of the present invention.

FIG. 5 is a diagram of the atmosphere control for the heat treatment step according to the present invention. This heat treatment step is first carried out in an atmosphere having an oxygen partial pressure of less than $5 \times 10^3$ Pa at a temperature of from 1300° C. to 1410° C. for a time of from 5 minutes to 6 hours and then in an atmosphere having an oxygen partial pressure of $5 \times 10^3$ Pa or more at a temperature of from 1100° C. to 1410° C. for a time of from 5 minutes to 8 hours.

The first heat treatment, carried out in an atmosphere having an oxygen partial pressure of less than $5 \times 10^3$ Pa at a temperature of from 1300° C. to 1410° C. for a time of from 5 minutes to 6 hours, brings the semiconductor silicon substrate into the condition shown in FIG. 3(a). The second heat treatment, carried out in an atmosphere having an oxygen partial pressure of $5 \times 10^3$ Pa or more at a temperature of from 1100° C. to 1410° C. for a time of from 5 minutes to 8 hours, provides the effect described above referring to FIG. 3(b), i.e., increases the thickness of the buried oxide film 7', extinguishes the defects lacking in oxygen atoms in the buried oxide film 7' and planarizes both the interface 11 between the semiconductor silicon film 8 and the buried oxide film 7' and the interface 12 between the buried oxide film 7' and the semiconductor silicon substrate 1.

Figure 6:
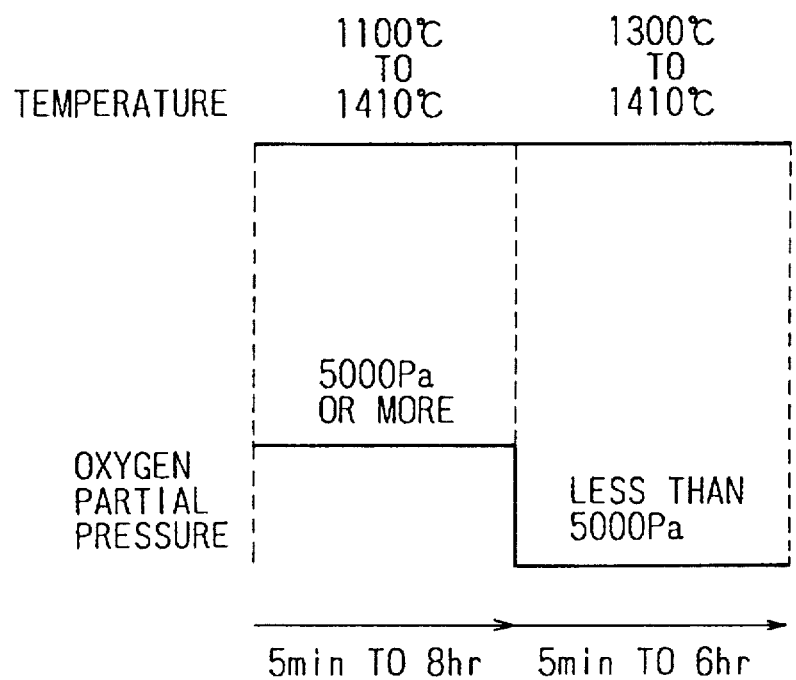
FIG. 6 is a diagram showing the temperature-oxygen partial pressure combination as a function of time according to another preferred embodiment of the present invention.

FIG. 6 is another diagram of the atmosphere control for the heat treatment step according to the present invention. This heat treatment step is first carried out in an atmosphere having an oxygen partial pressure of $5 \times 10^3$ Pa or more at a temperature of from 1100° C. to 1410° C. for a time of from 5 minutes to 8 hours and then in an atmosphere having an oxygen partial pressure of less than $5 \times 10^3$ Pa at a temperature of from 1300° C. to 1410° C. for a time of from 5 minutes to 6 hours.

The first heat treatment, carried out in an atmosphere having an oxygen partial pressure of $5 \times 10^3$ Pa or more at a temperature of from 1100° C. to 1410° C. for a time of from 5 minutes to 8 hours, provides the effect described above referring to FIGS. 4(a) and 4(b), i.e., increases both the thickness of the silicon oxide layer 5' and the size of the silicon oxide islands 6', extinguishes the defects lacking in oxygen atoms in the silicon oxide layer 5', and planarizes both the interface between the semiconductor silicon film 8 and the silicon oxide layer 5' and the interface between the silicon oxide layer 5' and the single crystalline silicon substrate 1. The second heat treatment, carried out in an atmosphere having an oxygen partial pressure of less than $5 \times 10^3$ Pa at a temperature of from 1300° C. to 1410° C. for a time of from 5 minutes to 6 hours, provides the effect described above referring to FIG. 4(c), i.e., extinguishes the silicon oxide islands 6' by incorporating them into the buried oxide film 7', thereby increasing the thickness of the latter.

Figure 7:
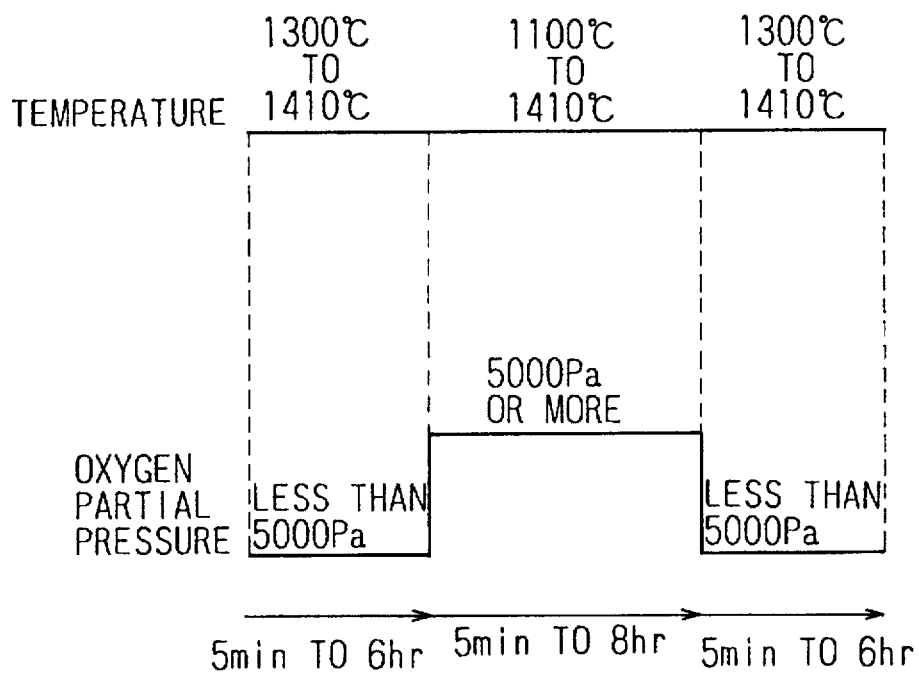
FIG. 7 is a diagram showing the temperature-oxygen partial pressure combination as a function of time according to another preferred embodiment of the present invention.

FIG. 7 is a further diagram of the atmosphere control for the heat treatment step according to the present invention. This heat treatment step is first carried out in an atmosphere having an oxygen partial pressure of less than $5 \times 10^3$ Pa at a temperature of from 1300° C. to 1410° C. for a time of from 5 minutes to 6 hours, then in an atmosphere having an oxygen partial pressure of $5 \times 10^3$ Pa or more at a temperature of from 1100° C. to 1410° C. for a time of from 5 minutes to 8 hours, and then in an atmosphere having an oxygen partial pressure of less than $5 \times 10^3$ Pa at a temperature of from 1300° C. to 1410° C. for a time of from 5 minutes to 6 hours.

The first two heat treatments have the same effect provided by the heat treatment step shown in FIG. 5. The last heat treatment, carried out in an atmosphere having an oxygen partial pressure of less than $5 \times 10^3$ Pa at a temperature of from 1300° C. to 1410° C. for a time of from 5 minutes to 6 hours, extinguishes the fine precipitates generated in the semiconductor silicon film 8 during the second heat treatment using the highest oxygen partial pressure, so as to provide the semiconductor silicon film 8 with a reduced defect amount.

The heat treatment steps shown in FIGS. 5 to 7 are followed by a heat treatment using an oxygen partial pressure of less than $5 \times 10^3$ Pa and a slow cooling of the semiconductor silicon substrate, enables the concentration of the oxygen dissolved in the semiconductor silicon film 8 to be gradually reduced as the saturated concentration of oxygen dissolvable in silicon is reduced by the temperature reduction. This provides a semiconductor silicon film 8 in which crystal defects due to the oxygen precipitation do not easily occur. To better prevent the occurrence of the crystal defects, the slow cooling is preferably carried out at a cooling rate of 2.5° C./minute or less. The slow cooling should be carried out at least in the temperature range of from 1300° C. and higher, preferably in the temperature range of from 1050° C. and higher.

The heat treatment using an oxygen partial pressure of $5 \times 10^3$ Pa or more is preferably carried out at a temperature of from 1100° C. to 1410° C., more preferably from 1330° C. to 1410° C. At temperatures less than 1100° C., the thickness of the buried oxide film 7' is not substantially increased in a practically acceptable heat treatment time and no substantial effect is obtained. Temperature more than 1410° C. are not suitable because a semiconductor silicon substrate has a reduced mechanical strength allowing slips and other crystal defects to occur. Temperatures of from 1330° C. to 1410° C. are preferred because oxygen and silicon atoms diffuse rapidly to reduce the heat treatment time and because both the interface 11 between the buried oxide film 7' and the semiconductor silicon film 8 and the interface 12 between the buried oxide film 7' and the semiconductor silicon substrate 1 can be made more abrupt and planar.

The heat treatment atmosphere having an oxygen partial pressure of $5 \times 10^3$ Pa or more is preferably composed of 100% oxygen or a gas mixture of oxygen gas and at least one of argon, helium and nitrogen gases. Other inert gases may be mixed with oxygen although the heat treatment cost is raised. It will be easily recognized that gases reactive with oxygen is not suitable.

The heat treatment atmosphere having an oxygen partial pressure of less than $5 \times 10^3$ Pa may be composed of 100% nitrogen or 100% argon when the semiconductor silicon substrate has a 50 nm or thicker surface oxide film prior to the heat treatment. When the substrate has no such oxide film, a preferable atmosphere is composed of a mixture of oxygen gas of a partial pressure of $0.1 \times 10^3$ Pa and at least one of argon, helium, and nitrogen gases, in order to prevent surface roughening of the semiconductor silicon substrate due to etching.

To form a continuous, well insulating buried oxide film inside the semiconductor silicon substrate, the oxygen ion dose and the ion implantation energy are preferably within the following ranges.

The first preferably ranges are an oxygen ion dose of from $0.3 \times 10^{18}$ ions/cm² to $0.4 \times 10^{18}$ ions/cm² and an ion implantation energy of from 150 keV to 220 keV. The second preferable ranges are an oxygen ion dose of from $1.25 \times 10^{18}$ ions/cm² to $2.2 \times 10^{18}$ ions/cm² and an ion implantation energy of from 150 keV to 220 keV. When a semiconductor silicon substrate oxygen-ion-implanted at an energy of less than 150 keV is heat-treated under the conditions according to the present invention, a large amount, or more than $1 \times 10^3$ per square centimeters, of crystal defects are occasionally generated. When a semiconductor silicon substrate oxygen-ion-implanted at a dose of less than $0.3 \times 10^{18}$ ions/cm², or a dose of more than $0.4 \times 10^{18}$ ions/cm² but less than $1.25 \times 10^{18}$ ions/cm², is heat-treated under the conditions according to the present invention, the thus-formed buried oxide film 7' may be discontinuous and/or may contain massive silicon particles, thereby having a very poor insulation characteristic, even when the ion implantation energy is within the range of from 150 keV to 220 keV.

EXAMPLES

Figure 8:
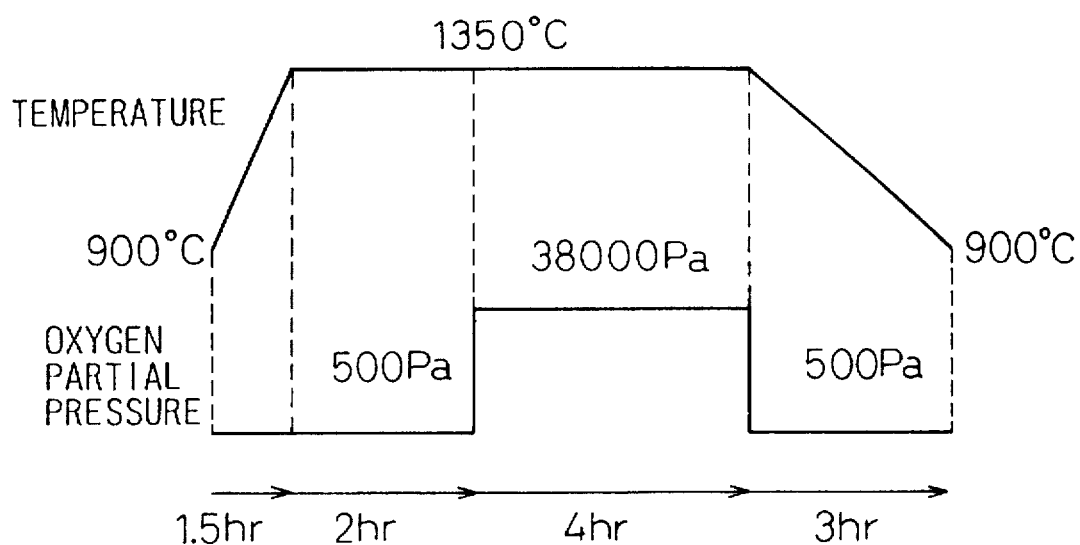
FIG. 8 is a diagram showing an example of the full heat treatment schedule (schedule A) according to the present invention.
Figure 9:
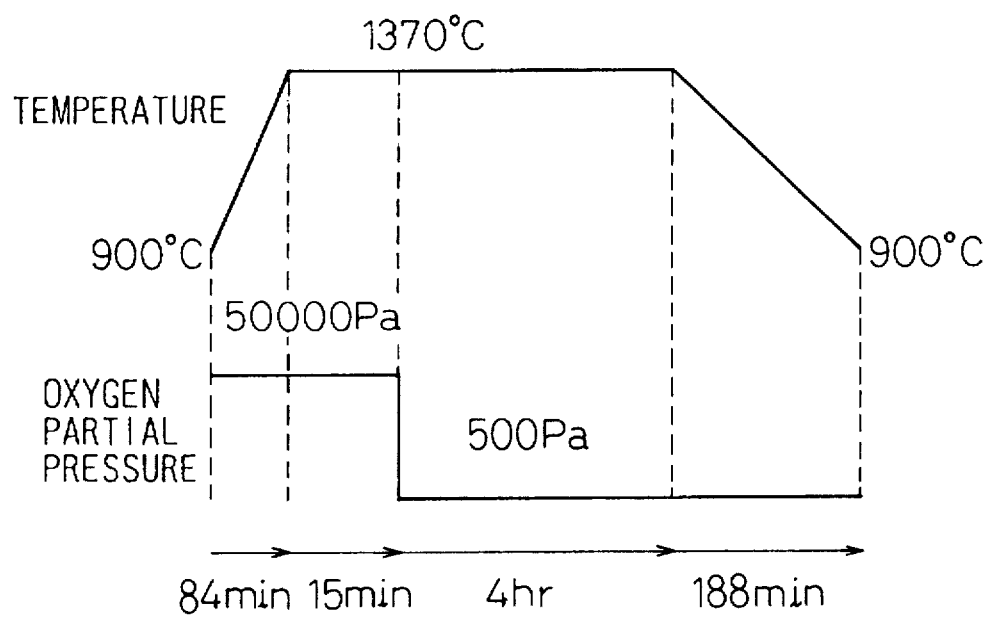
FIG. 9 is a diagram showing another example of the full heat treatment schedule (schedule B) according to the present invention.
Figure 10:
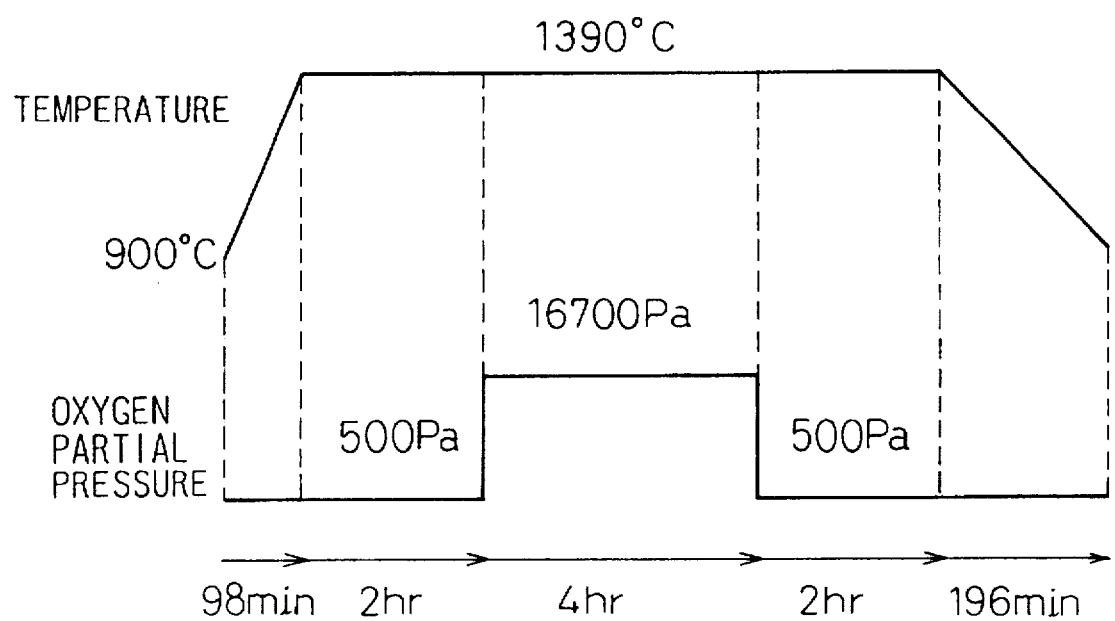
FIG. 10 is a diagram showing a further example of the full heat treatment schedule (schedule C) according to the present invention.

FIGS. 8 to 10 are diagrams showing three embodiments A, B and C of the heat treatment according to the present invention.

Prior to the heat treatment, oxygen ions were first implanted into single crystalline silicon substrates through the mirror-finished principal surface under the following conditions.

TABLE 1

| Oxygen Ion Implantation Condition | | |
|---|---|---|
| Symbol | Dose ions/cm² | Energy keV |
| a | $0.30 \times 10^{18}$ | 150 |
| b | $0.37 \times 10^{18}$ | 180 |
| c | $0.40 \times 10^{18}$ | 220 |
| d | $1.25 \times 10^{18}$ | 150 |
| e | $1.80 \times 10^{18}$ | 180 |
| f | $2.20 \times 10^{18}$ | 220 |

Figure 11:
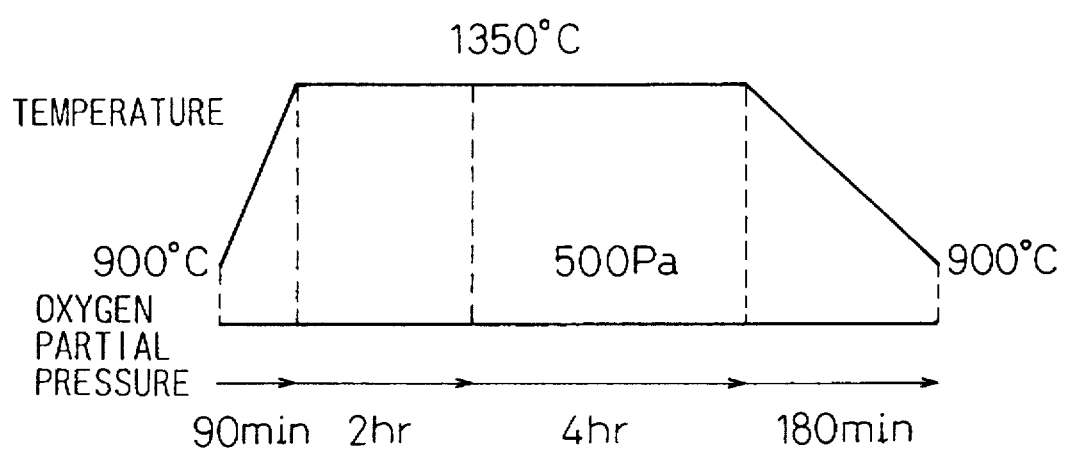
FIG. 11 is a diagram showing a typical example of the conventional heat treatment schedule (schedule D).

After the oxygen ion implantation, the silicon substrates were placed in a clean electric furnace and heat-treated in the sequences shown in FIGS. 8 to 10, respectively. For comparison, the conventional heat treatment shown in FIG. 11 (schedule D) was also conducted.

In the heat treatment shown in FIG. 8 (schedule A), the substrate was placed in the electric furnace containing an atmosphere composed of a gas mixture of oxygen and argon gases having an oxygen partial pressure of $5 \times 10^2$ Pa at 900° C. The furnace, i.e. the atmosphere, was then heated at a heating rate of 5° C./minute to 1350° C. and held there for 2 hours. The oxygen partial pressure of the atmosphere was then changed to $3.8 \times 10^4$ Pa and the furnace was held at 1350° C. for 4 hours. The oxygen partial pressure of the atmosphere was further changed to $5 \times 10^2$ Pa and the furnace was cooled at a cooling rate of 2.5° C./minute from 1350° C. to 900° C. The silicon substrate was then removed from the furnace.

In the heat treatment shown in FIG. 9 (schedule B), the substrate was placed in the electric furnace containing an atmosphere composed of a gas mixture of oxygen and argon gases having an oxygen partial pressure of $5 \times 10^4$ Pa at 900° C. The furnace, i.e. the atmosphere, was then heated at a heating rate of 5° C./minute to 1370° C. and held there for 15 minutes. The oxygen partial pressure of the atmosphere was then changed to $5 \times 10^2$ Pa and the furnace was held at 1370° C. for 4 hours. The atmosphere was maintained unchanged and the furnace was cooled at a cooling rate of 2.5° C./minute from 1370° C. to 900° C. The silicon substrate was then removed from the furnace.

In the heat treatment shown in FIG. 10 (schedule C), the substrate was placed in the electric furnace containing an atmosphere composed of a gas mixture of oxygen and argon gases having an oxygen partial pressure of $5 \times 10^2$ Pa at 900° C. The furnace, i.e. the atmosphere, was then heated at a heating rate of 5° C./minute to 1390° C. and held there for 2 hours. The oxygen partial pressure of the atmosphere was then changed to $1.67 \times 10^4$ Pa and the furnace was held at 1390° C. for 4 hours. The oxygen partial pressure of the atmosphere was then change to $5 \times 10^2$ Pa and the furnace was held at 1390° C. for 2 hours. Then, the atmosphere was maintained unchanged and the furnace was cooled at a cooling rate of 2.5° C./minute from 1390° C. to 900° C. The silicon substrate was then removed from the furnace.

After the heat treatment, the sections of the silicon substrates were observed in a transmission electron microscope to determine the thickness of the buried oxide film. Other samples from the heat-treated silicon substrates were immersed in a diluted aqueous solution of hydrofluoric acid to remove a surface oxide film formed by thermal oxidation during the heat treatment. The samples were then immersed in an aqueous solution of potassium hydroxide to remove the semiconductor silicon film and expose the buried oxide film, the roughness of which was then determined by a scanning atomic force microscope (AFM). Other samples from the heat-treated silicon substrates were immersed in a diluted aqueous solution of hydrofluoric acid to remove a surface oxide film formed by thermal oxidation during the heat treatment. The thus-exposed semiconductor silicon film was ion-implanted with boron ions at a dose of $5 \times 10^{16}$ ions/cm$^2$ and heat-treated at 900° C. for 30 minutes to render the film conductive. The usual lithography and etching technique was then utilized to divide the semiconductor silicon film into numerous small patterns having an area of from 0.01 mm$^2$ to 25 mm$^2$. A voltage was applied to the divided pattern on both sides of the sandwich-like piece of the semiconductor silicon film, the buried oxide film and the semiconductor silicon substrate, to measure a current flowing through the buried oxide film and thereby determine the number of the current leakage defects and the dielectric breakdown strength.

The results are summarized in Table 2. It can be seen from the results that, in comparison with the conventional process, the process according to the present invention provides an increased thickness of the buried oxide film, a reduced interface roughness, a reduced number of the current leakage defects, and an increased dielectric breakdown strength.

TABLE 2

| No. | Oxygen ion implantation | Heat treatment | Thickness of buried oxide film (nm) | Interface roughness (nm) | Current leakage defects (cm$^{-2}$) | Dielectric breakdown strength (MV/cm) |
|---|---|---|---|---|---|---|
| 1 | a | A | 83 | 1 | 3.1 | 6 |
| 2 | b | A | 102 | 1 | 3.0 | 7 |
| 3 | c | A | 110 | 1 | 2.7 | 6 |
| 4 | d | A | 345 | 0.8 | 0.4 | 8 |
| 5 | e | A | 496 | 0.7 | 0.2 | 8 |
| 6 | f | A | 606 | 0.6 | 0.1 | 9 |
| 7 | b | B | 92 | 0.6 | 1.0 | 6 |
| 8 | e | B | 446 | 0.5 | 0.2 | 10 |
| 9 | b | C | 93 | 0.3 | 0.8 | 8 |
| 10 | e | C | 445 | 0.2 | 0.1 | 10 |
| Conventional | b | D | 85 | 3 | 9.2 | 4 |
| | e | D | 413 | 2 | 3.0 | 5 |

As herein described above, the present invention provides a process for producing a high quality SOI semiconductor substrate in which the number of the defects providing a path for current leakage is reduced, the buried oxide layer has an improved dielectric breakdown strength, the interface between the buried oxide film and the adjoining silicon layers has a small roughness, and the buried oxide film can be produced with a wider range of thickness. Therefore, the semiconductor substrate according to the present invention, when used to produce silicon semiconductor devices such as complementary MIS transistors and bipolar transistors, can provide a high performance device having a reduced current leakage and an improved dielectric breakdown strength with a high product yield.

We claim:

1. A process for producing a semiconductor substrate, including the phases of implanting oxygen ions into a semiconductor silicon substrate through one surface thereof to form an oxygen concentration layer in the semiconductor silicon substrate, and then heat-treating the semiconductor substrate to cause a chemical reaction to occur between the implanted oxygen ions and the silicon, thereby forming a buried insulating silicon oxide film in the semiconductor silicon substrate, wherein:

the heat treating phase for forming the buried insulating silicon oxide film includes at least a heat treatment step using an atmosphere having an oxygen partial pressure of $5 \times 10^3$ Pa or more.

2. A process according to claim 1, wherein the heat treatment step using an atmosphere having an oxygen partial pressure of $5 \times 10^3$ Pa or more is performed at a temperature of from 1100° C. to 1410° C.

3. A process according to claim 1, wherein the heat treatment step using an atmosphere having an oxygen partial pressure of $5\times10^3$ Pa or more is performed at a temperature of from 1330° C. to 1410° C.

4. A process according to claim 1, wherein the heat treatment step using an atmosphere having an oxygen partial pressure of $5\times10^3$ Pa or more is performed for a time of from 5 minutes to 8 hours.

5. A process according to claim 1, further including, prior to the heat treatment step using an atmosphere having an oxygen partial pressure of $5\times10^3$ Pa or more, another heat treatment step using an oxygen partial pressure of $0.1\times10^3$ Pa or more and less than $5\times10^3$ Pa, a heat treatment temperature of from 1300° C. to 1410° C., and a heat treatment time of from 5 minutes to 6 hours.

6. A process according to claim 1, further including, after the heat treatment step using an atmosphere having an oxygen partial pressure of $5\times10^3$ Pa or more, another heat treatment step using an oxygen partial pressure of less than $5\times10^3$ Pa, a heat treatment temperature of from 1300° C. to 1410° C., and a heat treatment time of from 5 minutes to 6 hours.

7. A process according to claim 1, wherein the heat treating phase is completed by a final heat treatment step using an oxygen partial pressure of $5\times10^3$ Pa or less and a reduction of heat treatment temperature to 1300° C. or less.

8. A process according to claim 1, wherein the heat treating phase is completed by a final heat treatment step using an oxygen partial pressure of less than $5\times10^3$ Pa and a reduction of heat treatment temperature to 1050° C. or less.

9. A process according to claim 7, wherein the oxygen partial pressure is less than $5\times10^3$ Pa and the speed of the reduction of heat treatment temperature is 2.5° C./minute or less.

10. A process according to claim 1, wherein the atmosphere of the heat treatment step using an atmosphere having an oxygen partial pressure of $5\times10^3$ Pa or more is composed of 100% oxygen or a mixture of oxygen and at least one selected from the group of argon, helium, and nitrogen.

11. A process according to claim 5, wherein the atmosphere of the heat treatment step using an atmosphere having an oxygen partial pressure of less than $5\times10^3$ Pa is composed of one selected from the group of: a mixture of oxygen and at least one selected from the group of argon, helium, and nitrogen; 100% nitrogen; and 100% argon.

12. A process according to claim 1, wherein the oxygen ions are implanted at a dose of from $0.3\times10^{18}$ ions/cm$^2$ to $0.4\times10^{18}$ ions/cm$^2$ and at an implantation energy of from 150 keV to 220 keV.

13. A process according to claim 1, wherein the oxygen ions are implanted at a dose of from $1.25\times10^{18}$ ions/cm$^2$ to $2.2\times10^{18}$ ions/cm$^2$ and at an implantation energy of from 150 keV to 220 keV.

14. A process according to claim 2, further including, prior to the heat treatment step using an atmosphere having an oxygen partial pressure of $5\times10^3$ Pa or more, another heat treatment step using an oxygen partial pressure of $0.1\times10^3$ Pa or more and less than $5\times10^3$ Pa, a heat treatment temperature of from 1300° C. to 1410° C., and a heat treatment time of from 5 minutes to 6 hours.

15. A process according to claim 3, further including, prior to the heat treatment step using an atmosphere having an oxygen partial pressure of $5\times10^3$ Pa or more, another heat treatment step using an oxygen partial pressure of $0.1\times10^3$ Pa or more and less than $5\times10^3$ Pa, a heat treatment temperature of from 1300° C. to 1410° C., and a heat treatment time of from 5 minutes to 6 hours.

16. A process according to claim 4, further including, prior to the heat treatment step using an atmosphere having an oxygen partial pressure of $5\times10^3$ Pa or more, another heat treatment step using an oxygen partial pressure of $0.1\times10^3$ Pa or more and less than $5\times10^3$ Pa, a heat treatment temperature of from 1300° C. to 1410° C. and a heat treatment time of from 5 minutes to 6 hours.

17. A process according to claim 2, further including, after the heat treatment step using an atmosphere having an oxygen partial pressure of $5\times10^3$ Pa or more, another heat treatment step using an oxygen partial pressure of less than $5\times10^3$ Pa, a heat treatment of from 1300° C. to 1410° C., and a heat treatment time of from 5 minutes to 6 hours.

18. A process according to claim 3, further including, after the heat treatment step using an atmosphere having an oxygen partial pressure of $5\times10^3$ Pa or more, another heat treatment step using an oxygen partial pressure of less than $5\times10^3$ Pa, a heat treatment of from 1300° C. to 1410° C., and a heat treatment time of from 5 minutes to 6 hours.

19. A process according to claim 4, further including, after the heat treatment step using an atmosphere having an oxygen partial pressure of $5\times10^3$ Pa or more, another heat treatment step using an oxygen partial pressure of less than $5\times10^3$ Pa, a heat treatment of from 1300° C. to 1410° C., and a heat treatment time of from 5 minutes to 6 hours.

20. A process according to claim 5, further including, after the heat treatment step using an atmosphere having an oxygen partial pressure of $5\times10^3$ Pa or more, another heat treatment step using an oxygen partial pressure of less than $5\times10^3$ Pa, a heat treatment of from 1300° C. to 1410° C., and a heat treatment time of from 5 minutes to 6 hours.

* * * * *